United States Patent [19]
Wilson
[11] 3,735,485
[45] May 29, 1973

[54] METHOD OF PROVIDING THERMALLY CONDUCTIVE GROUND CONNECTIONS FOR INTEGRATED CIRCUITS

[75] Inventor: Richard W. Wilson, Phoenix, Ariz.
[73] Assignee: Motorola, Inc., Franklin Park, Ill.

[22] Filed: Jan. 25, 1971
[21] Appl. No.: 109,451

[52] U.S. Cl. .......................... 29/591, 29/589, 29/625
[51] Int. Cl. .......................... B01j 17/00
[58] Field of Search .......................... 29/625, 577, 589, 29/590, 591

[56] References Cited

UNITED STATES PATENTS 2,923,651 2/1960 Petriello ..........29/625
3,264,402 8/1966 Shakeen et al. ..........29/625
3,302,272 2/1967 Braun ..........29/625

*Primary Examiner*—Charles W. Lanham
*Assistant Examiner*—W. Tupman
*Attorney*—Mueller & Aichele

[57] ABSTRACT

A method for providing thermally conductive ground connections for semiconductor devices is provided in which a thermally and electrically conductive plug is put into a hole in a substrate before or after conductive material is deposited on the back of the substrate and then the conductive material is made thick enough to provide a ground plane to retain the plug in place and to make thermal and electrical connections between the plug and the ground plane. Then the integrated circuit may be bonded to the top of the plug.

7 Claims, 1 Drawing Figure

PATENTED MAY 29 1973 3,735,485
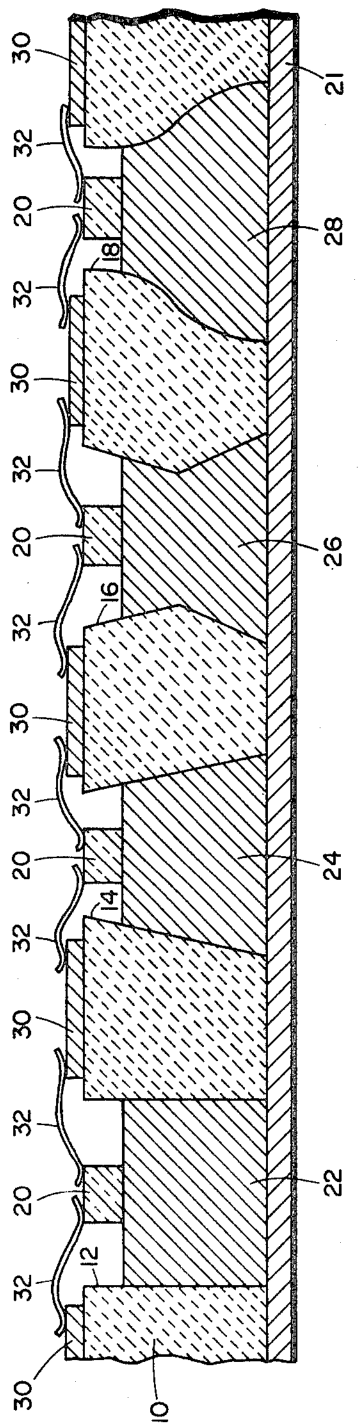
INVENTOR.
Richard W. Wilson
BY Mueller & Aichele
ATTY'S.

METHOD OF PROVIDING THERMALLY CONDUCTIVE GROUND CONNECTIONS FOR INTEGRATED CIRCUITS

BACKGROUND

It is known to provide a ground plane having temperature and electrically conductive mounds comprising a part of or which are attached to the ground plane, the mounds extending through a nonconductive substrate, and semiconductor devices being applied to the tops of the mounds. The mounds act to electrically connect the semiconductor device to the ground plane and to conduct heat therefrom to the ground plane.

The mounds may be provided integrally with the ground plane in which case there are problems of registering the mounds with the holes in the ceramic substrate, whereby difficulties are encountered in assembling the ground plane to the substrate. The ground plane may be soldered to the back of the substrate and then slugs or mounds may be dropped into the holes in the substrate and the slugs or mounds may be soldered to the substrate. If enough solder is used to solder the ground plane or plate to the substrate, a little solder will collect in each of the holes, which will result in displacing the slugs, whereby the tops of the slugs will not be in the same plane or in a desired plane and furthermore, the excess solder may migrate up in the hole high enough to do damage to the semiconductor chip that is later put on the mound or slug. Furthermore, further processing of the substrate including the ground plane may be at such a high temperature that the solder joints between the slugs and the base or ground plane may be destroyed or damaged.

SUMMARY

In accordance with this invention, slugs are forced into holes in the substrate, the relative size and shape of the slugs with respect to the holes in the substrate being such that the slugs are held mechanically in the holes by engagement of the surface of the slug with the contacting surface of the hole. Then, a conductive film or layer is provided on the back of the substrate as by evaporation or sputtering. Then the film or layer on the back of the substrate is built up by electroplating for example to the point where the back or ground plate is thick enough to bridge the gaps between the slugs and the back of the substrate, whereby the back of the substrate has a continuous ground plane fixed thereto and to which the slugs are electrically and thermally connected. The film may be deposited on the back of the substrate before or after the slugs are forced into the holes in the substrate. While further processing involving heating may loosen the plugs in their holes, the further heating will not separate the plug from the ground plate or change its position with respect thereto. The top of the slugs may be below the top surface of the substrate by a distance equal to the thickness of the semiconductor chips.

DESCRIPTION

The invention will be better understood upon reading the following description in connection with the accompanying drawing in which the sole FIGURE is useful for explaining the inventive method.

In accordance with the invention, a nonconductive substrate 10, which may be of ceramic material, is provided having holes 12, 14, 16 and 18 therethrough. As noted, the hole 12 is cylindrical, the hole 14 is frustoconical having its small end up, the hole 16 is of the shape of the frustrum of two cones whose small ends coincide and the hole 18 has a curved shape which is useful for electrically matching the semiconductor chip 20 which is put on a mound to the ground plate as will be further explained. The slugs 22, 24, 26 and 28 which match the holes 12, 14, 16 and 18 respectively in shape, are forced into their respective holes or are swaged thereinto, whereby, due to the roughness of the inner surface of the holes 12, 14, 16 and 18 and due to the fact that the slugs are force fitted or swaged into the respective holes, the slugs are held in their respective holes mechanically, that is, by interengagement of the surface of the slugs with the surface of the holes. The slugs may be of any shape disclosed or of any other shape, as long as they are mechanically held in their holes until the back plate 22 is formed. The slugs may all be of one shape or they may be of various shapes as desired. In general, though the slugs 22, 24, 26 and 28 are shown in the FIGURE as fitting their holes 12, 14, 16 and 18 closely, gaps may occur between the slugs and insides of the holes into which they have been forced. The bottoms of the slugs are flush with the bottoms of the substrate.

Then the back plate 21 is provided. This is done by depositing as by vacuum evaporation or sputtering, sputtering being preferred, a film or films of metal or combination of metals such as titanium and copper on the back of the substrate 10 and over the back ends of the plugs 22, 24, 26 and 28 until the film is thick enough for electroplating thereon. Typically the thickness of the titanium is about 1,000 angstrom units and of the copper is 10,000 angstrom units. Then, the thickness of the ground plane 21 is brought up to a desired thickness by electroplating, whereby during which time, the gaps mentioned above are bridged and the plugs 22, 24, 26 and 28, in effect, become integral with the back plane 21. It is noted that the tops of the plugs 22, 24, 26 and 28 are all on the same plane and below the top of the substrate 10 by the thickness of the semiconductor devices 20 which are bonded to the top of the plugs 22, 24, 26 and 28. Conductors 30 may be deposited on the top of the substrate 10 and wires 32 may be connected between the bonding pads on the devices 20 and appropriate conductors 30.

If desired, the metallization of the bottom of the substrate 10 as by sputtering or vacuum evaporation may take place before the plugs 22, 24, 26 and 28 are forced into their holes. An advantage of so doing is that while the use of copper and titanium is necessary to cause the metallization film to stick to the ceramic substrate 10, there is no need to apply such a film to the copper plugs 22, 24, 26 and 28.

It will be noticed that the plugs 24 and 28 cannot fall out of the substrate 10 when the ground plane 21 has been provided and that the plugs 26 cannot fall out of the substrate 10 in either direction. It is also noted that the curved shape of the plug 28 provides electrical matching of the waves that may be present on the semiconductor chips 22 thereon and the ground plane 21.

While in the later stages of the processing, the plugs, which are held mechanically in their holes, may loosen in their holes, they will be kept in the substrate and in their proper position in their respective holes by being in effect integrally fixed to the ground plate 21, unlike when the known soldering process mentioned above is used to provide the plugs. Also, there is no problem of registering holes to mounds as when the plugs or mounds are provided as an integral part of the substrate. Other advantages of the disclosed method is that the cost of fabrication is low, the precise etching of parts and expensive locating fixtures are not necessary and that the resultant structure is cleaner than prior art such structures.

What is claimed is:

1. The method of providing an electrical equipment which comprises:

providing an insulating substrate having first and second surfaces and having a hole therethrough;

forcing a conductive plug into said hole so that a first end of said plug is substantially flush with said first surface of said substrate and a second end of said plug is below said second surface of said substrate by a distance substantially equal to the thickness of a semiconductor device to be put on said plug, said plug being retained in said hole by mechanical interaction of the outside surface of said plug and the inside surface of said hole;

applying metalization to said first surface of said substrate;

building up said metalization to provide a ground plane which is integrally fixed to said plug; and securing a semiconductor device to said second end of said plug.

2. The invention of claim 1 in which said insulating substrate is of ceramic material and said plug is copper.

3. The invention of claim 1 in which said metallization is provided by sputtering said surface of said substrate.

4. The invention of claim 1 in which said metallization is provided by vacuum evaporation of a suitable metal.

5. The invention of claim 1 in which said metallization is provided before said plug is forced into said hole.

6. The invention of claim 1 in which said metallization is provided after said plug is forced into said hole.

7. The invention of claim 1 in which said building up is provided by electroplating.

* * * * *